United States Patent
Slade

(10) Patent No.: US 6,609,242 B1
(45) Date of Patent: Aug. 19, 2003

(54) AUTOMATED CREATION OF POWER DISTRIBUTION GRIDS FOR TILED CELL ARRAYS IN INTEGRATED CIRCUIT DESIGNS

(75) Inventor: Jeremy Glen Slade, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 09/909,480

(22) Filed: Jul. 20, 2001

(51) Int. Cl.[7] ............................................. G06F 17/50
(52) U.S. Cl. ......................................... 716/14; 716/11
(58) Field of Search ...................... 716/14, 11

(56) References Cited

U.S. PATENT DOCUMENTS 6,209,123 B1 * 3/2001 Maziasz et al. ............... 716/14

* cited by examiner

Primary Examiner—M. Tran

(57) ABSTRACT

A VLSI circuit having regular, tiled arrays of cells is designed using a method and an apparatus to allow automatic creation of the artwork needed to distribute power from a top-level power grid (i.e., lines VDD and GND) to power rails in lower-level metal layers of cells. That is, the cell arrays may include power rails that need to be connected to a top-level power grid. The method and apparatus may be used in conjunction with software tools used to create other elements of the VLSI design. The method and apparatus automate the task of connecting each of the cells in the array to the power lines.

19 Claims, 8 Drawing Sheets

AUTOMATED CREATION OF POWER DISTRIBUTION GRIDS FOR TILED CELL ARRAYS IN INTEGRATED CIRCUIT DESIGNS

TECHNICAL FIELD

The technical field is integrated circuit design.

BACKGROUND

In integrated circuits, and in particular, very large scale integrated (VLSI) circuits, power (i.e., ground (GND) and supply (VDD)) must be supplied from the power supply and ground to various metal layers that comprise the circuit. The process of creating the required power pathway, or power grid, is called power strapping.

Current power strapping methods and systems rely on one of two approaches. First, the power grid may be created manually each time a circuit is created, or re-created. This approach carries a high maintenance overhead, and cannot be accomplished quickly. A second, or rule-based approach relies on fixed definitions or rules for creation of the power grid. The rule-based approach is automated, and thus has advantages over the manual approach. However, the rule-based approach may work only for a small number of circuits, and different rules and definitions may be required for other integrated circuit designs. Furthermore, the rule-based approach may waste valuable resources by designating power strapping shapes that are larger than what is actually required to distribute power to the circuit.

SUMMARY

In many VLSI circuits, a portion of the VLSI design includes regular, tiled arrays of cells. The cell arrays may include power rails that need to be connected to top-level power lines. A method and an apparatus allow automatic creation of the artwork needed to distribute power from the top-level power grid (i.e., lines VDD and GND) to power rails in the cells' lower-level metal layers. The method and apparatus may be used in conjunction with software tools used to create other elements of the VLSI design. The method and apparatus automate the task of connecting each of the cells in the array to the power lines.

The method begins by identifying, or setting up, all cell power rails. Then, working from the cell power rails to the top metal layer power grid, intersections between resources in the adjacent metal layers are defined. Using the intersections, power strapping shapes are defined within the available resources. The result is a network or power grid from the top-level power lines down to the power rails in the cells.

DESCRIPTION OF THE DRAWINGS

The detailed description will refer to the following drawings, wherein like numerals refer to like elements, and wherein.

DETAILED DESCRIPTION

Integrated circuits, and in particular, very large scale integrated (VLSI) circuits may include cell regions comprising multiple cells that are tiled together. Many of these cells may have the same footprint, that is, the cells may have the same width (x-direction) and height (y-direction). The cells may also comprise multiple layers (z-direction). Thus, for a number of rows and columns of these cells, a repeatable pattern in both the horizontal (x) and vertical (y) directions may be created. In some applications, the cells may form repeatable patterns in only the horizontal or the vertical direction.

For example, in VLSI circuits, cell regions may be set aside so that as a signal crosses a large distance on a chip, the signal is amplified, or repeated. This process minimizes propagation delays. The regions on the chip set aside for the repeating process are referred to as repeater farms. Cells that make up the repeater farms may have the same footprint.

In any integrated circuit, power (i.e., ground (GND) and supply (VDD)) must be provided from the power supply and ground to various metal layers that comprise the integrated circuit. The process of creating the required power pathway, or power grid, is called power strapping. In some areas of the integrated circuit, creation of the power grid is automated using a method and an apparatus to identify cell power rails, locate intersections of the cell power rail resources between metal layers, and build power strapping shapes from the intersections.

Figure 1:
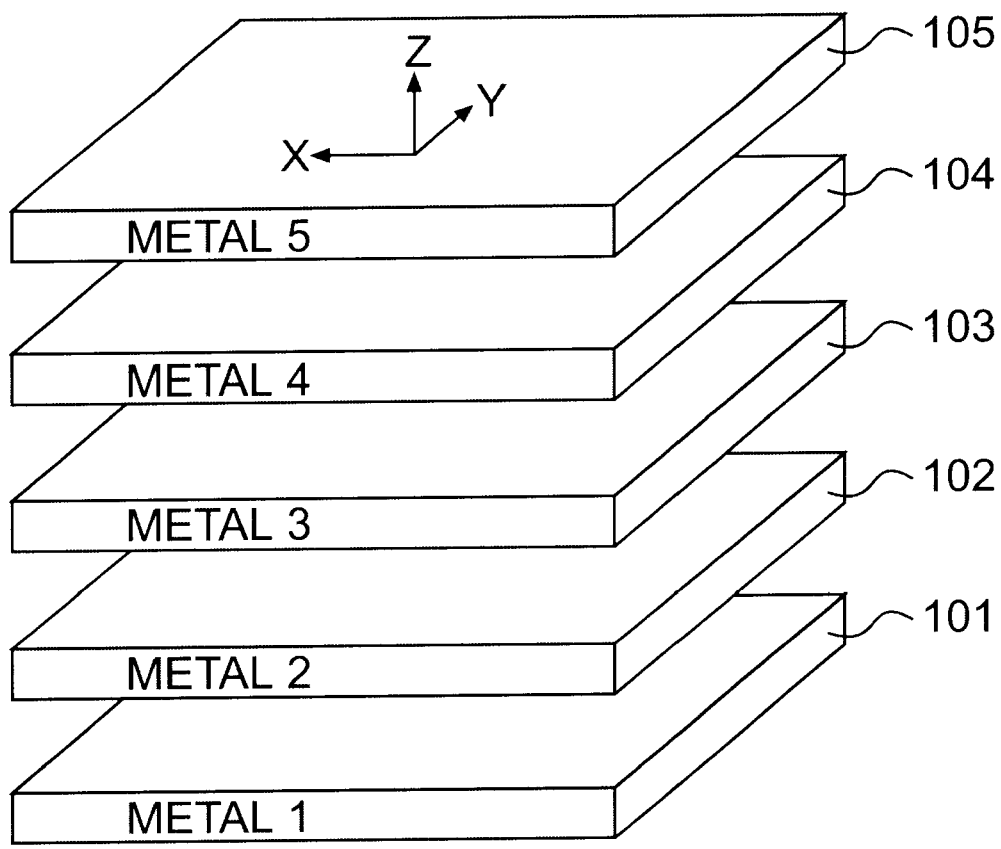
FIG. 1 shows a VLSI cell.

FIG. 1 shows a cell having multiple metal layers 101–105. A top layer, metal5 105, may include power lines GND and VDD (not shown). The metal5 105 metal layer is formed on an x-y plane. Proceeding in a negative z direction, adjacent, lower level metal layers are reached. Lower level adjacent metal layers may carry power rails (also not shown). The power lines and power rails may be oriented orthogonally from one layer to the next adjacent layer. The power lines and power rails may run the entire length of a cell array. The power rail location may be defined by an x or a y coordinate value in the x-y plane comprising a metal layer. That is, for a horizontally aligned metal layer having power rails running horizontally, the location of a power rail can be defined by its y coordinate value. Also defined for each metal layer may be one or more power rail resource shapes. For power strapping to occur in a particular metal layer or cell, the defined power rail may coincide with one or more of the power rail resource shapes.

The VLSI circuit may comprise many of the cells shown in FIG. 1. These cells may be arranged, or tiled, such that the power rails connect from one cell to the next. That is, the cells to be power strapped may be designed to have a power rail each for VDD and GND that runs the full width of the cell. The cells can be tiled together such that the power rails of adjacent cells in a row abut to form a continuous metal track.

Figure 2:
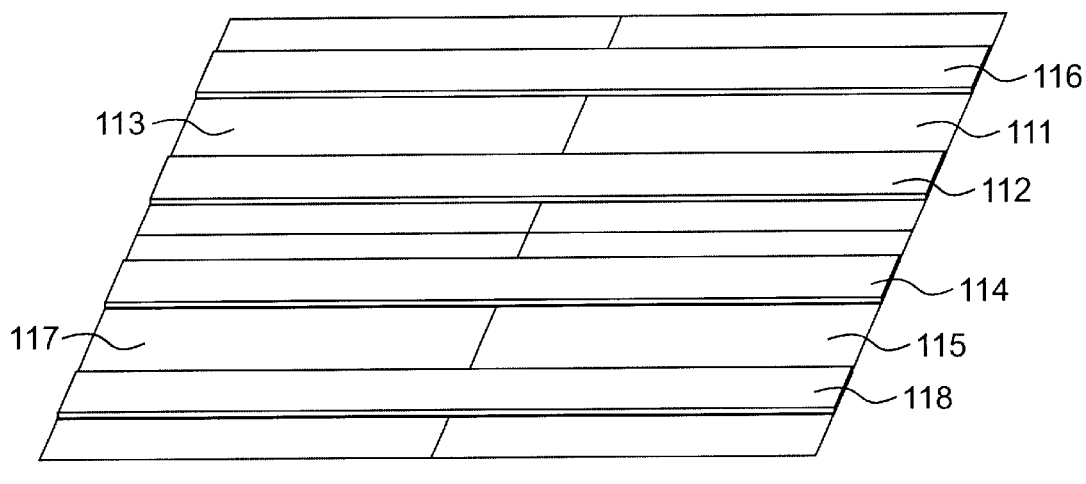
FIG. 2 shows a single layer of tiled VLSI cells including power rails.

FIG. 2 shows a single metal layer of a four cell array 100, with the four cells tiled together such that power rails for GND and VDD connect to form continuous tracks. Specifically, cells 111, 113, 115 and 117 are tiled together to form the cell array 100. The tiled cells 111, 113, 115, and 117 may comprise a section of a VLSI circuit, and many additional cells may be tiled together with the cells 111, 113, 115, and 117 shown in FIG. 2. A complete set of cells may then be used to comprise the cell array 100. As shown in FIG. 2, the tiled arrangement forms VDD power rails 112 and 114 and GND power rails 116 and 118. For ease of description, the VDD and GND power rails may be designated as horizontal rails, and the cells 115 and 117 comprise a horizontal row of cells. Conversely, the cells 111 and 115 comprise a vertical row, or column, of cells.

In addition to power rails, each of the cells, such as the cells 111, 113, 115 and 117, may include resource regions (not shown in FIG. 2) that are set aside for power strapping functions. The apparatus and process described below uses the designated resource regions and the power rails to create power grids having a minimal footprint at each of the cell metal layers.

The first step in designing the power grid is to locate all power rails. The power rails may be identified by noting locations of individual cell power rails, and determining where adjacent cell power rails connect. Since layout of a cell is generally stored in code, locating the power rails requires reading code for the cell layout or artwork. The process may be automated using a power strapping apparatus. To execute the power strapping process, the power strapping apparatus first sets up all cell power rails. The power straps may only be set up in available power strapping resource regions. The resource regions (resources) may be designated as available for ground (GND) or supply (VDD), or may be designated for either GND or VDD. After the cell power rails are set up, the power strapping apparatus works up from the lowest metal layer (i.e., layer 101 in FIG. 1) to the top metal level, and finds all intersection regions between the power strap resources in adjacent metal layers. This may require that resources in adjacent metal layers be aligned in orthogonal directions. For example, if the metal2 resources run horizontally, then the metal1 and metal3 resources run vertically. The identified intersection regions may be stored in a table, arranged, for example, from left to right and top to bottom. One intersection region is defined for each of the intersecting layers, for each region where the power strapping resources in the layers intersect. Finally, the power strapping apparatus uses the intersection regions to build power strapping shapes in the designated resource regions. That is, adjacent intersection regions are joined together to construct the actual power strapping shapes. All intersection regions derived from the same original power strapping resource can be joined together. In addition, all GND power strapping resources can be joined together, and all VDD power strapping shapes can be joined together.

The power strapping shapes may be "stitched" or joined together in the z-direction between different layers in the same cell. The power strapping shapes may also be "stitched" or joined together horizontally (x-direction) and/or vertically (y-direction) at the same layer level between adjacent cells. The result is a power strap network or grid that runs in a cell from the top metal layer, through adjacent metal layers, to the lowest metal layer, and from one cell to one or more adjacent cells, provided sufficient power strapping resources are available so that an intersection region can be made for each pair of layers. That is, the power strap network extends in the x-y plane from cell to cell at a given layer level, and in the z-direction within the cells. The resulting power strap grids use only the minimum amount of power strapping resource shapes, and any metal left over can be used for other purposes.

Figure 3:
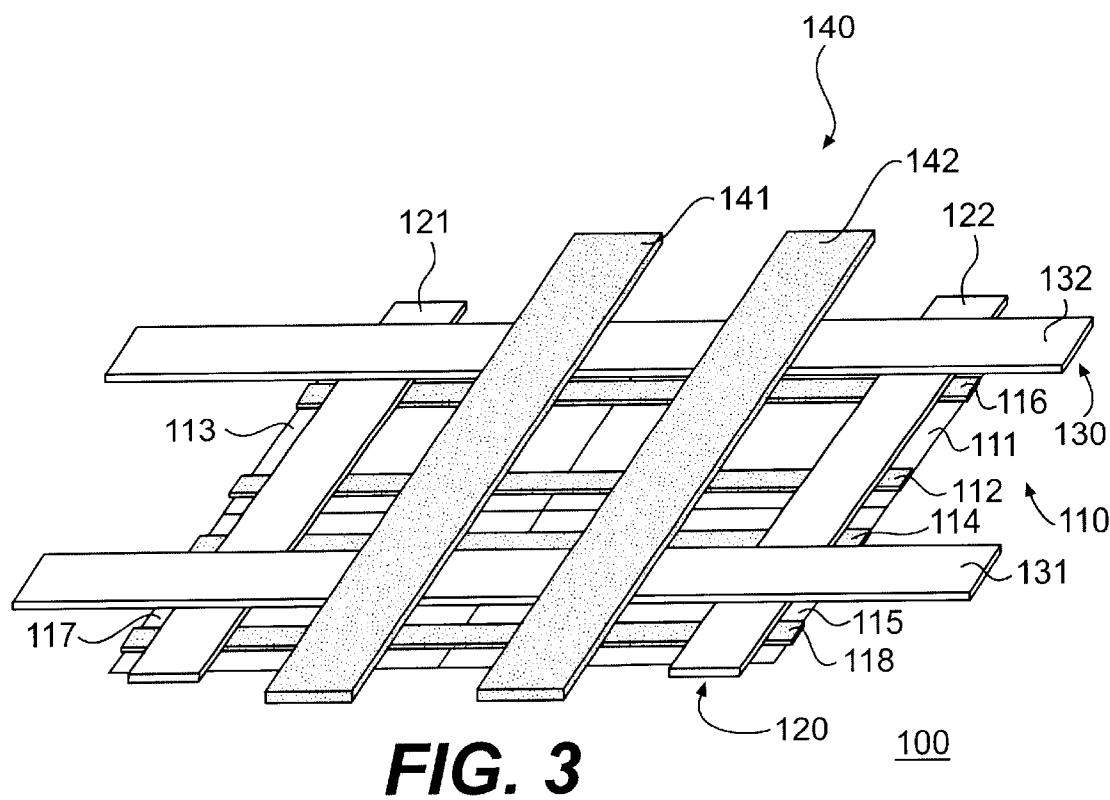
FIG. 3 shows intersections of power rails and resources in tiled VLSI cell arrays.

FIG. 3 illustrates the cell array 100 with resources identified and intersection regions designated. The cell array 100 includes the cells 111, 113, 115 and 117 in metal layer1 (110) (i.e., the lowest metal layer). An adjacent metal layer 120 includes resources 121 and 122. Resources 121 and 122 are run orthogonal to the VDD rails 112 and 114 and the GND rails 116 and 118. A metal layer 130 adjacent the metal layer 120 includes resources 131 and 132. Finally, a top layer 140 includes resources 141 and 142. The resource 141 is designated as the top layer GND and the resource 142 is designated as the top layer VDD.

Figure 4:
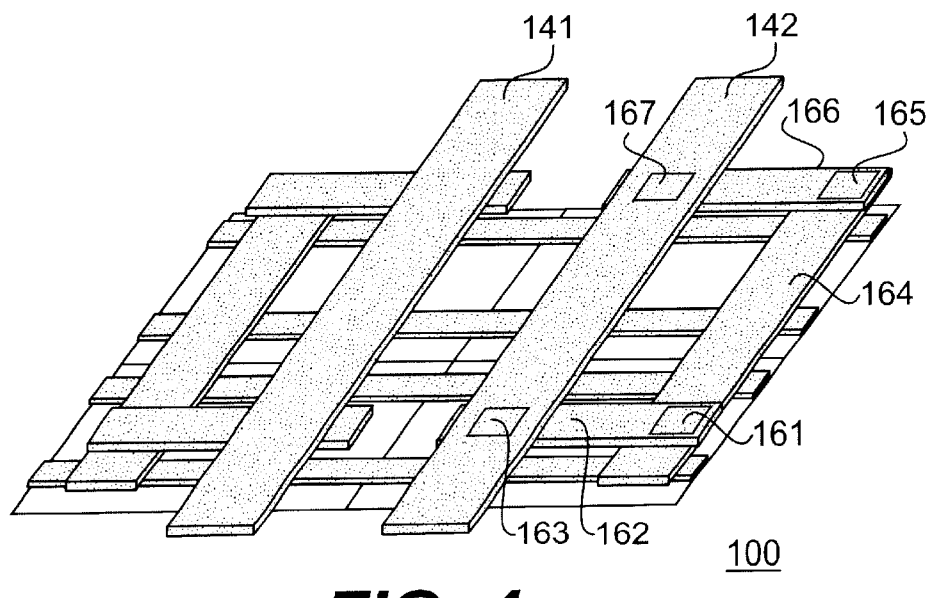
FIG. 4 shows a completed power grid.

FIG. 4 illustrates the cell array 100 with the power strap shapes for GND and VDD identified. As shown, a GND power strap grid 151 comprises portions of the resources 121, 131 and 132 coupled to the GND rails 118 and 116 and the top-level GND 141. A VDD power strap grid 152 comprises portions of the resources 122, 131, 132 coupled to the VDD rails 114 and 112, and the top-level VDD 142. Thus, power grids are completed from the top level GND and VDD to the bottom layer of the cell array 100, with intersections made in each layer of the cell array 100. The power grids use only a minimum amount of the available power strapping resources in each layer, leaving space on the cell array 100 for other purposes. Moreover, the process for defining the power grids is automated, and need not be repeated each time an array with the footprint of the cell array 100 is produced.

More particularly, and considering the VDD grid 152, intersections 161 and 163 (shown in outline as underlying the top level VDD 142) between metal layers are from the same resource, namely the resource 131. (As shown in FIG. 4, the intersections (e.g., the intersections 161 and 163) should be understood to exist in both layer i and in layer i+1.) In metal layer 2, the intersection 161 is additionally in the same resource (the resource 122) as the intersection 165. As a result, a power shape 162 may be constructed stitching together the intersections 161 and 163 in metal layer 3. Similarly, the intersections 161 and 165 can be stitched together to form the power shape 164 in metal layer 2. Finally, the intersection 165 and intersection 167 can be stitched together to form power shape 166.

As is clear from FIG. 4, intersections that occur in GND cannot be stitched together with intersections in VDD, even if such intersections occur in the same resource. Other limitations may be imposed on constructing power shapes. For example, a maximum allowable distance, or separation, may be specified between intersections. In an embodiment, there is no limitation on the allowable separation.

Figure 5:
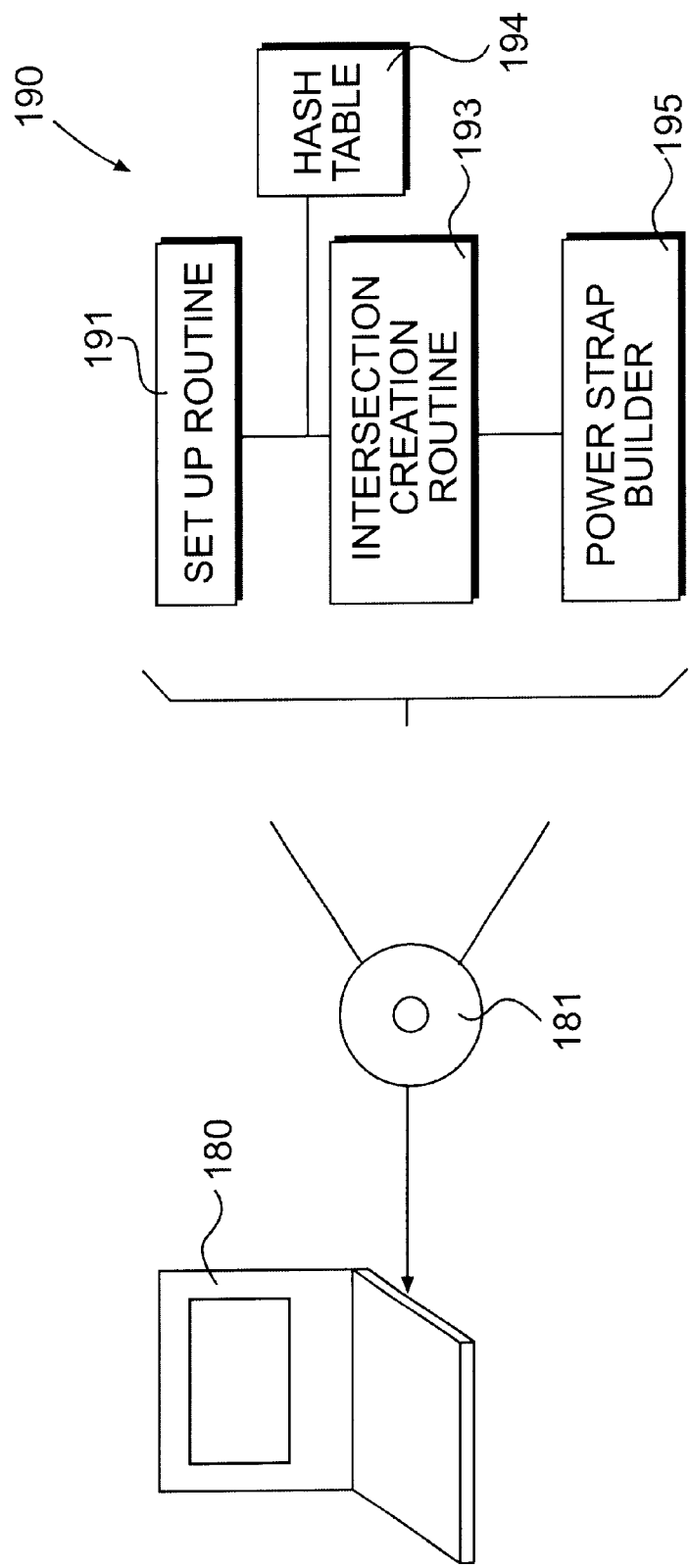
FIG. 5 is a block diagram of a computer system and software used to design the power grid of FIG. 4.

FIG. 5 is a block diagram of a computer system 180 having software 190 used to design the power grid of FIG. 4. The software 190 includes a setup routine 191 that is used to determine power rails (GND and VDD) in each metal layer, for each cell in the array comprising the repeater farm. The power rails thus determined are then named; i.e., the ground power rails are named GND and the source power rails are named VDD. Intersection creation routine 193 then determines locations of all intersections between the power rails and resources in the metal layers. The routine 193 starts by creating a hash table 194 in which the intersections are recorded. A key to the hash table is the x or y location of a center of an intersection. That is, depending on the direction of metal in the layer, the hash value will be either the x or the y value of the intersection center point. For example, if the layer direction is horizontal, the y value of the center point is the hash value. All intersection center points along the same y value will then be stored together in a heap, and can later be used to create a shape connecting neighboring intersection regions. The routine 193 executes in an iterative fashion, starting with the lowest, or $i^{th}$ metal layer, and proceeding in increments of i+1 to the top metal layer. Power strap builder routine 195 then operates in an iterative fashion to build the power strap shapes that will comprise the repeater farm power grids. All intersections derived from a same original resource can be joined together. The power strap builder 195 also requires that all intersections have a same name. That is, an intersection region derived from a GND power rail cannot be connected to an intersection region derived from a VDD power rail. For each metal layer, the power strap builder 195 will determine if intersection regions defined (stored) in the heap can be joined. Once all metal layers in all cells have been processed, the software 190 will provide complete GND and VDD power grids. The thus-generated power grids minimize the use of metal in a layer, thereby freeing up resources for other applications. The power grids are also constructed with maximum flexibility, and the software 190 may be used for any number of different repeater farm designs.

As shown in FIG. 5, the software 190 may reside on a removable, computer-readable storage medium, such as the compact disk 181. However, other storage medium devices may be used with the computer system 180. The computer system 180 may be a general purpose computer system. In an embodiment, the computer system 180 may comprise a personal computer.

Figure 6A:
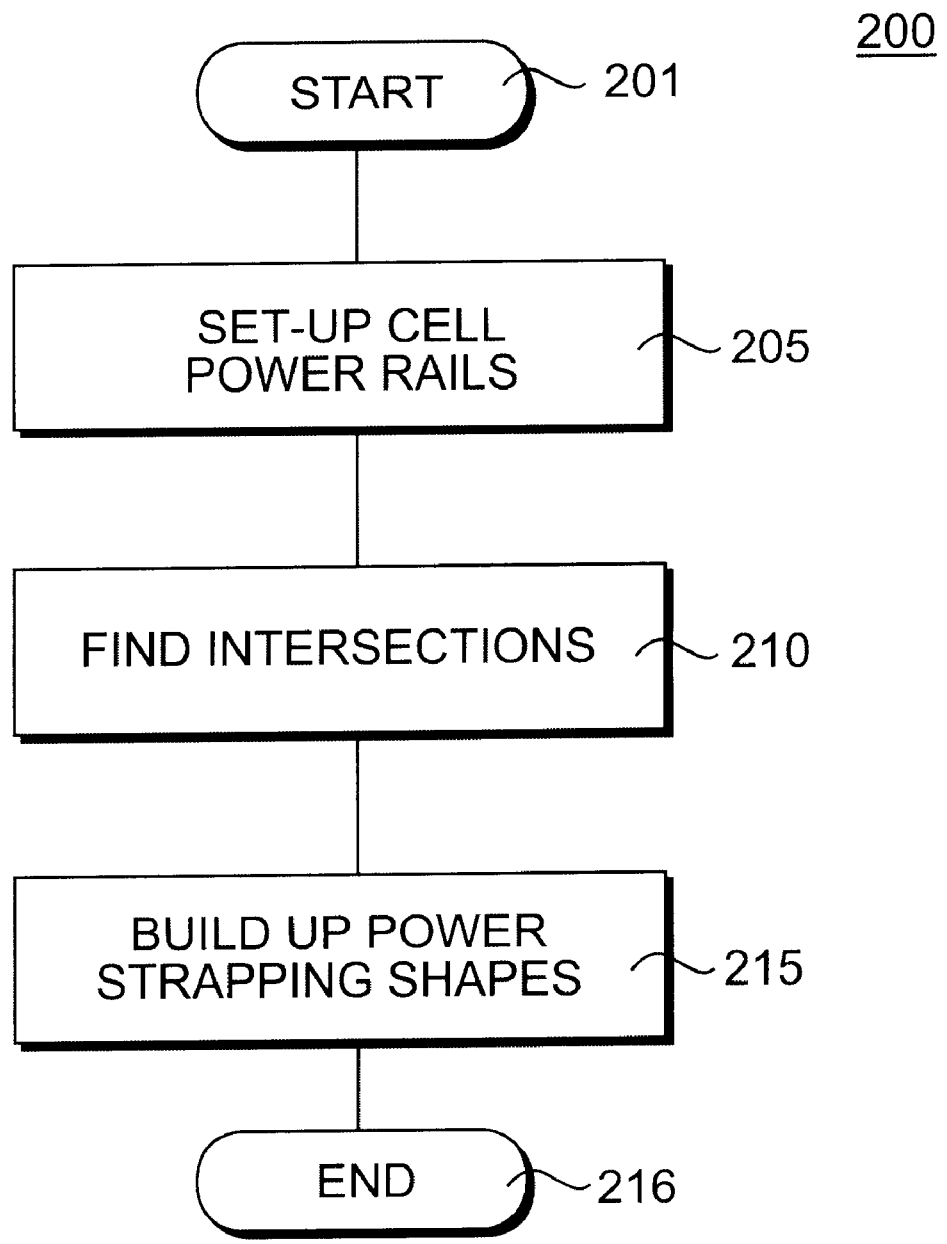
FIGS. 6A–6D are flowcharts showing processes executed by the software of FIG. 5.

FIGS. 6A–6D are flowcharts illustrating a power strapping operation 200. In FIG. 6A, the operation 200 begins in start block 201. In block 205, all cell VDD and GND power rails are determined. The operation 200 then moves to block 210. In block 210, intersections between resource shapes are determined. In block 215, the power strapping shapes are built using the resource shape intersections. The thus constructed power strapping shapes comprise the VDD and GND power grids. In block 216, the operation 200 ends.

Figure 6B:
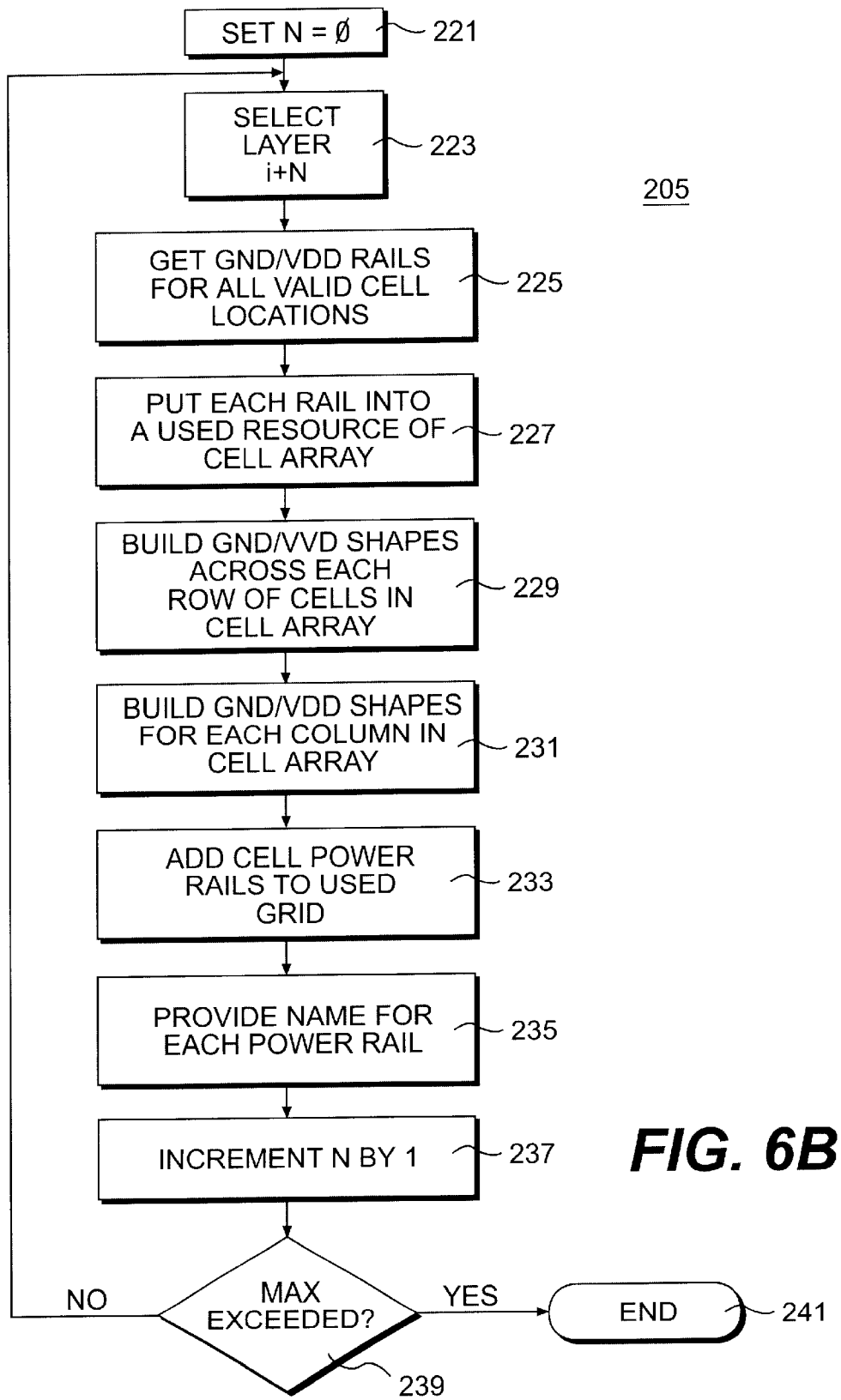

FIG. 6B shows the operation 205 in detail. The operation 205 is completed for each metal layer of a cell array such as the cell array 100 (shown in FIG. 2). In block 221, the operation 205 is initialized with N, representing an incremental value, set to 0. In block 223, layer i+N is selected. Thus, with N set to 0, the lowest metal layer is selected. In block 225, the GND and VDD rails are generated for all valid cell locations. In block 227, each of the VDD and GND rails are placed into a used (i.e., designated) resource of the cell array. In block 229, GND and VDD rail shapes are built across each row of cells in the cell array. In block 231, GND and VDD shapes are built for each column in the cell array. In block 233, the cell array power rails are added to the designated resources grid. Finally, in block 235, each of the power rails is provided with a name. The value of N is then incremented by 1, block 237. In block 239, the value of i+N+1 is compared to a maximum layer number. If i+N+1 exceeds the number of metal layers, the operation 205 moves to block 241 and ends. Otherwise, the operation 205 returns to block 223, and the next metal layer is selected.

Figure 6C:
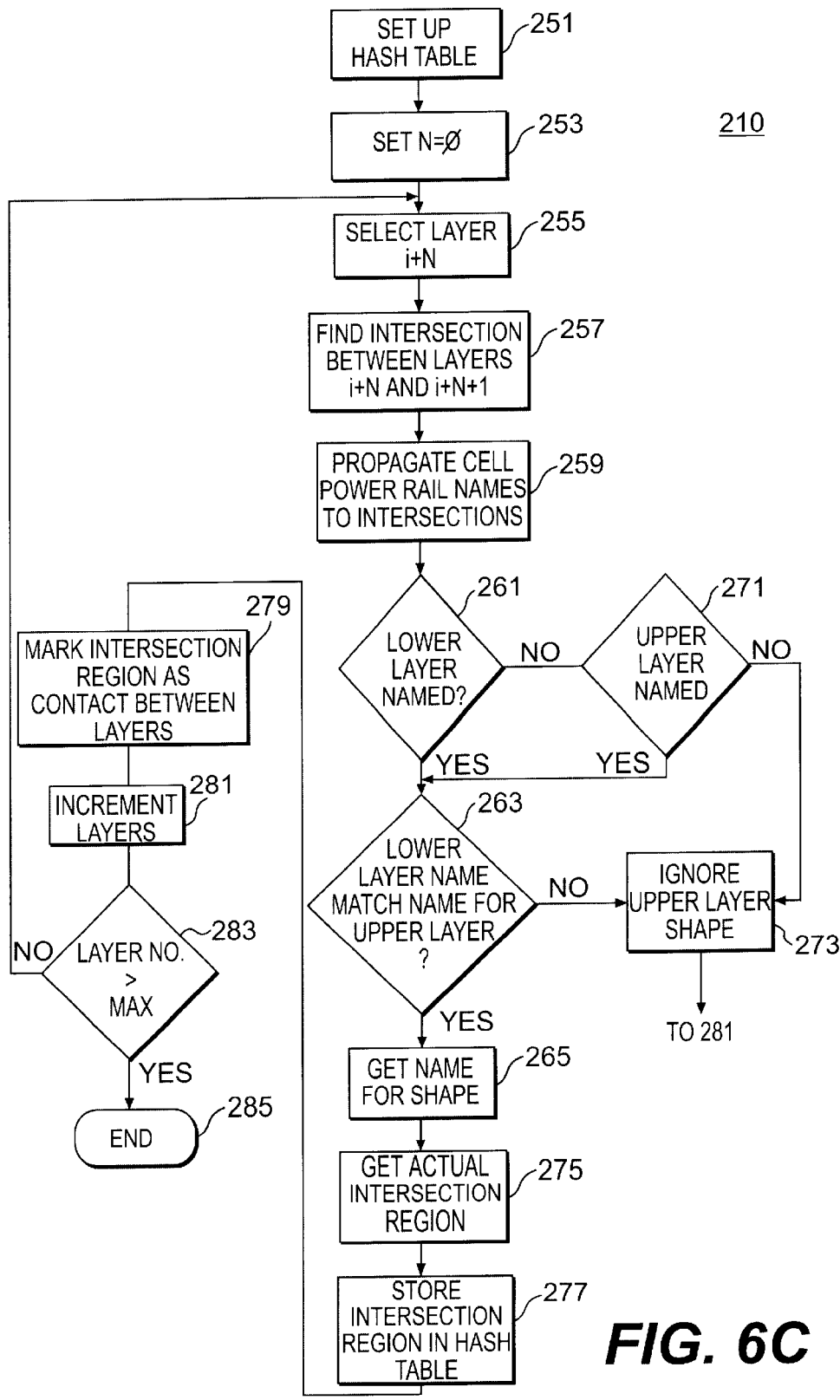

FIG. 6C shows the operation 210 in detail. In block 251, a hash table is set up to store intersection regions. In block 253, N is set to 0, and in block 255, the i+N layer (i.e., the lowest metal layer) is selected. In block 257, resource intersections between layer i+N and layer i+N+1 are determined (i.e., a lower layer and an upper layer are compared to determine areas of intersection between the designated resources). The thus determined intersection regions are placed in a heap in the hash table. In block 259, proper cell power rail names (e.g., GND and VDD) are propagated to the intersection regions. In block 261, the lower layer is checked to determine if a name is assigned to the resource shape. If a name is assigned, the name of the lower layer resource shape is compared to a name of a corresponding upper layer resource shape, block 263. For example, a resource shape in layer i that is named GND is checked to determine if the corresponding resource shape in layer i+1 is also named GND. If the names of the resource shapes match, in block 265, the name is applied to the intersection region.

In block 261, if no name is assigned to the lower layer resource shape, the operation 210 moves to block 271, and the upper layer resource shape is examined to determine if the upper layer resource shape is named. If the upper layer resource shape is named, the operation 210 moves to block 263. If the upper layer resource shape is not named (block 271) the upper layer resource shape is ignored (block 273) (i.e., the resource shape is not used to construct an intersection region). The operation 210 then moves to block 281. In block 263, if the lower layer resource shape name does not match the name of the corresponding upper layer resource shape, the operation 210 also moves to block 273, and the upper layer resource shape is ignored.

Following block 265 the operation 210 moves to block 275, and the actual intersection region is designated. In block 277 the intersection region is stored in a heap in the hash table. Next, in block 279, the intersection region is marked as a contact between the layers i+N and i+N+1. In block 281, the value of i+N is incremented by 1. In block 283, the value of i+N is compared to the maximum number of cell metal layers in the cell array 100. If i+N+1 exceeds the maximum number of metal layers, the operation 210 ends (block 285). In block 283, if the maximum number of metal layers in not exceeded, the operation 210 returns to block 255, and the next layer is selected.

The operation 210 shown in FIG. 6C may include additional looping subroutines such that all layers in a particular cell, and all layers at a specific z-location in the cell array 100 are processed to generate a complete power grid that connects the cells and layers in the x, y, and z-directions, within the constraints of the resource shapes.

Figure 6D:
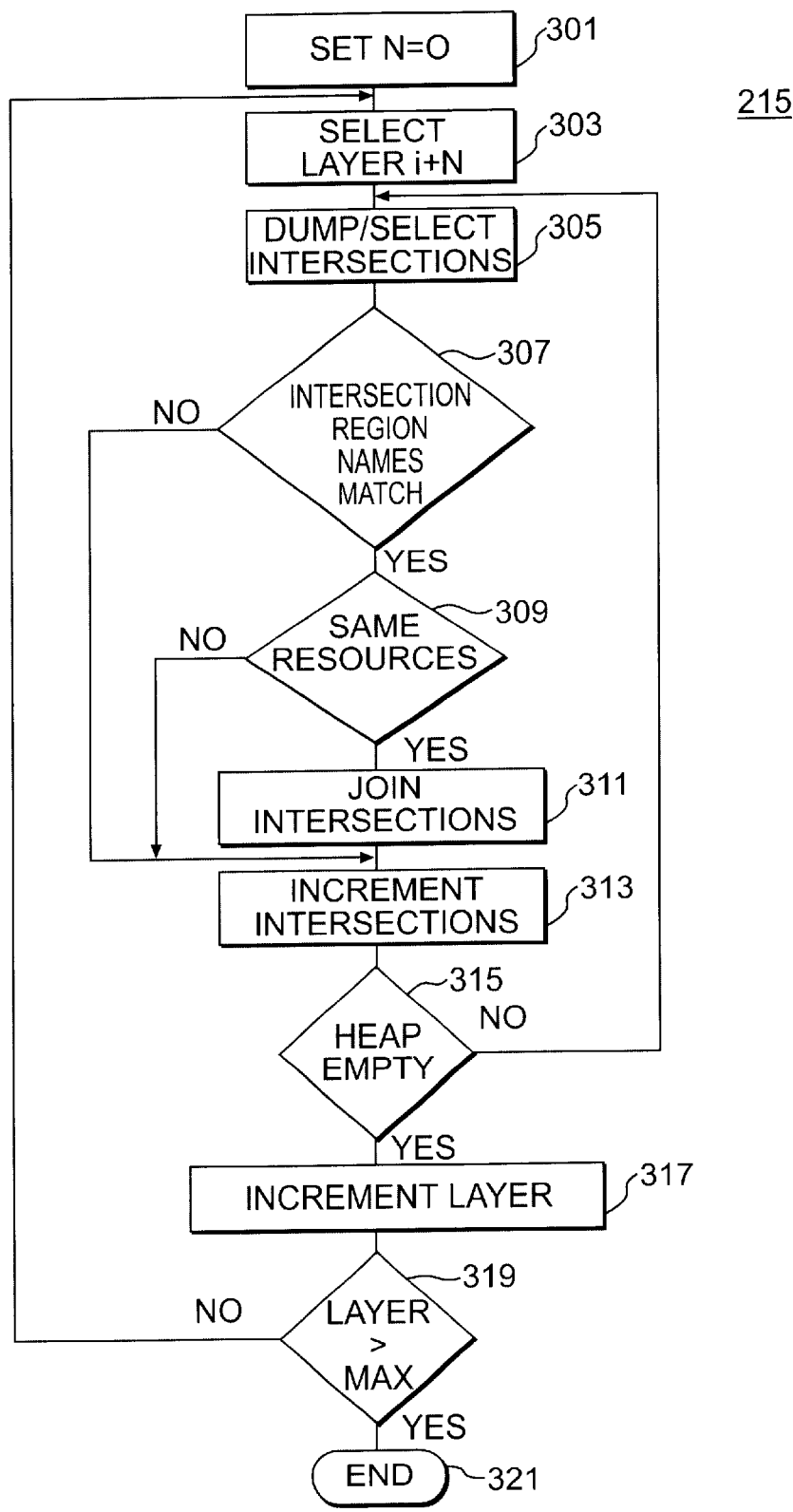

FIG. 6D shows the operation 215 in detail. In block 301, the operation 215 is initialized, and N is set to 0. In block 303, the i+N layer is selected. In block 305, a heap corresponding to a specific key value (i.e., the x or y value) is dumped, and all intersection regions having the same key value are then evaluated to determine if the intersection regions can be stitched together to form a power strap shape in the selected metal layer. First, the names of the intersection regions are compared, starting with, for example, a left-most intersection region, and proceeding horizontally through the cell array. In block 307, the names of adjacent intersection regions are compared. If the compared names match, the operation 215 moves to block 309, and the originally designated resources from which the intersection regions were derived are compared. If the resources are the same, the operation moves to block 311, and the adjacent intersection regions are joined to form at least a portion of a power strap shape. In block 313, the intersection region is incremented by 1, and in block 315 the heap is checked to determine if another intersection region is available. If another intersection region is available, the next intersection region is selected, and the operation 215 returns to block 305. Otherwise, the operation 215 moves to block 317. In block 317, the value of i+N is incremented by 1. In block 319, the value of i+N is—compared to the maximum number of cell metal layers in the cell array. If i+N+1 exceeds the maximum number of metal layers, the operation 215 ends (block 321). In block 319, if the maximum number of metal layers in not exceeded, the operation 215 returns to block 303, and the next layer is selected.

What is claimed is:

1. A method for creating a power distribution grid for tiled cells in an integrated circuit, the cells each having a plurality of metal layers, the method, comprising:

defining power rails on one or more of the metal layers for one or more of the cells, wherein a power rail is constrained to exist in designated resources;

determining intersections of the resource shape between vertically adjacent metal layers; and stitching together the intersections to form power strap shapes, comprising:
in each metal layer:
determining names of neighboring intersections,
determining original designated resources encompassing the neighboring intersections, and
stitching the neighboring intersections together when the names and the original designated resources match.

2. The method of claim 1, wherein the step of defining the power rails, comprises:

(a) selecting a metal layer;
(b) defining a ground power rail;
(c) defining a supply power rail; and
(d) repeating steps (a)–(c) for each of the plurality of metal layers for each of the cells, wherein the step of defining the power rails begins with a lowest metal layer in a cell and proceeds to a top metal layer in the cell, and wherein power rails in z-direction adjacent metal layers are orthogonal.

3. The method of claim 1, further comprising placing the determined intersections in a heap comprising sorted entries, and wherein the heap comprises a portion of a hash table.

4. The method of claim 3, wherein a key to the hash table is an x value or a y value of a center of an intersection.

5. The method of claim 1, wherein either or both the name and the original designated resources do not match, the power strap shape is stopped.

6. The method of claim 1, further comprising providing a name for each of the determined power rails, wherein the names comprise one of ground and supply.

7. The method of claim 1, wherein the cells comprise a repeater farm.

8. A computer-readable medium comprising programming for automatic creation of a power grid in an integrated circuit cell array, the programming providing execution of the following steps:

defining power rails on one or more of the metal layers for one or more of the cells, wherein a power rail is constrained to exist in designated resources;

determining intersections of the resources shape between vertically adjacent metal layers; and stitching together the intersections to form power strap shapes, comprising:
in each metal layer:
determining names of neighboring intersections,
determining original designated resources encompassing the neighboring intersections, and
stitching the neighboring intersections together when the names and the original designated resources match.

9. The computer-readable medium of claim 8, wherein the step of defining the power rails, comprises:

(a) selecting a metal layer;
(b) defining a ground power rail;
(c) defining a supply power rail; and
(d) repeating steps (a)–(c) for each of the plurality of metal layers for each of the cells, wherein the step of defining the power rails begins with a lowest metal layer in a cell and proceeds to a top metal layer in the cell, and wherein power rails in vertically adjacent cells are orthogonal.

10. The computer-readable medium of claim 8, wherein the steps further comprise placing the determined intersections in a heap comprising sorted entries, and wherein the heap comprises a portion of a hash table.

11. The computer-readable medium of claim 10, wherein a key to the hash table is an x or y value of a center of an intersection.

12. The computer-readable medium of claim 8, wherein either or both the name and the originally designated resources do not match, the power strap shape is stopped.

13. The computer-readable medium claim 8, wherein the steps further comprise providing a name for each of the determined power rails, wherein the names comprise one of ground and supply.

14. A method for creating power grids in an integrated circuit, the integrated circuit comprising a plurality of tiled cells, the cells each comprising a plurality of metal layers, the method comprising:

defining power rails on one or more of the metal layers for one or more of the cells, wherein a power rail is constrained to exist in designated resources, comprising:
determining an x or a y reference point for power rails in a cell, and
designating the power rails as one of ground and supply;

determining intersections of the resources between vertically adjacent metal layers; and stitching together the intersections to form power strap shapes.

15. The method of claim 14, wherein the stitching step, comprises:
in each metal layer:
determining names of neighboring intersections,
determining original designated resources encompassing the neighboring intersections, and
stitching the neighboring intersections together when the names and the original designated resources match.

16. The method of claim 14, further comprising placing the determined intersections in a heap comprising sorted entries, and wherein the heap comprises a portion of a hash table.

17. The method of claim 16, wherein a key to the hash table is an x value or a y value of a center of an intersection.

18. An apparatus for automated creation of power distribution grids in an integrated circuit, wherein the integrated circuit comprises a plurality of cells having a same footprint, each of the plurality of cells comprising a plurality of layers, the apparatus comprising:

means for determining power rails in one or more of the plurality of layers;

means for building intersections between the power rails and resources in the one or more of the plurality of layers; and means for building power strap shapes based on the intersections, wherein the means for building the power strap shapes comprises:
means for determining intersection names of adjacent intersections,
means for determining original designated resource shapes and encompassing the adjacent intersections, and
means for stitching the adjacent intersections together when the intersection names and the original designated resources match.

19. The apparatus of claim 18, wherein the means for determining the power rails comprises means for naming the power rails, wherein the names include one of ground and supply, and wherein the means for building the intersections comprises means for storing reference information related to the intersections.

* * * * *